United States Patent
Chikita

(10) Patent No.: US 10,973,132 B2
(45) Date of Patent: Apr. 6, 2021

(54) RADIO-FREQUENCY MODULE AND COMMUNICATION APPARATUS

(71) Applicant: Murata Manufacturing Co., Ltd., Kyoto (JP)

(72) Inventor: Hironori Chikita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/937,036

(22) Filed: Jul. 23, 2020

(65) Prior Publication Data

US 2020/0359507 A1 Nov. 12, 2020

Related U.S. Application Data

(63) Continuation of application No. PCT/JP2018/045307, filed on Dec. 10, 2018.

(30) Foreign Application Priority Data

Jan. 25, 2018 (JP) .............................. JP2018-010666

(51) Int. Cl.
*H04B 1/40* (2015.01)
*H04B 1/00* (2006.01)
(Continued)

(52) U.S. Cl.
CPC ............... *H05K 3/46* (2013.01); *H03F 3/195* (2013.01); *H04B 1/006* (2013.01); *H04B 1/40* (2013.01);
(Continued)

(58) Field of Classification Search
None
See application file for complete search history.

(56) References Cited

U.S. PATENT DOCUMENTS 5,903,820 A * 5/1999 Hagstrom ................ H04B 1/40
455/82
7,027,789 B2 * 4/2006 Ammar .................... H01L 23/66
330/289

(Continued)

FOREIGN PATENT DOCUMENTS

JP 2004253693 A 9/2004
JP 2005123909 A 5/2005
(Continued)

OTHER PUBLICATIONS

International Search Report issued in Application No. PCT/JP2018/045307, dated Jan. 8, 2019.
(Continued)

*Primary Examiner* — Pablo N Tran
(74) *Attorney, Agent, or Firm* — Pearne & Gordon LLP

(57) ABSTRACT

An RF module includes a switch IC having connection electrodes on a first main face and connection electrodes on a second main face; a mounting substrate which has a first mounting face at the first main face side and a second mounting face at the second main face side and in which the switch IC is mounted; signal lines for a band A, which are formed at the first mounting face side of the mounting substrate; signal lines for a band B, which are formed at the second mounting face side of the mounting substrate; a band A filter; and a band B filter. Among the band A filter and the band B filter, only the band A filter is mounted on the first mounting face and only the band B filter is mounted on the second mounting face.

15 Claims, 5 Drawing Sheets

(51) Int. Cl.
*H05K 3/46* (2006.01)
*H04B 1/38* (2015.01)
*H03F 3/195* (2006.01)

(52) U.S. Cl.
CPC ............ *H01L 2224/16225* (2013.01); *H01L 2924/19105* (2013.01); *H03F 2200/111* (2013.01); *H03F 2200/451* (2013.01)

(56) References Cited

U.S. PATENT DOCUMENTS

| | | | | |
|---|---|---|---|---|
| 7,127,269 | B2* | 10/2006 | Shih | H04B 1/005 455/552.1 |
| 7,167,688 | B2* | 1/2007 | Li | H04B 1/38 455/106 |
| 7,409,190 | B2* | 8/2008 | Murata | H05K 1/0243 455/76 |
| 8,326,344 | B2* | 12/2012 | Kemmochi | H05K 1/0243 455/550.1 |
| 8,467,738 | B2* | 6/2013 | Gorbachov | H04B 1/006 455/73 |
| 9,344,140 | B2* | 5/2016 | Reisner | H01L 29/737 |
| 2005/0104685 | A1 | 5/2005 | Kuroki et al. | |
| 2009/0285135 | A1* | 11/2009 | Rousu | H04B 1/0057 370/297 |
| 2013/0137381 | A1* | 5/2013 | Vassiliou | H04B 1/56 455/67.15 |
| 2014/0378182 | A1* | 12/2014 | Hara | H05K 1/0216 455/553.1 |
| 2015/0119104 | A1* | 4/2015 | Saji | H04W 88/10 455/553.1 |
| 2015/0133067 | A1* | 5/2015 | Chang | H04B 1/40 455/78 |
| 2015/0179621 | A1 | 6/2015 | Matsumoto et al. | |
| 2015/0237712 | A1 | 8/2015 | Tago | |
| 2015/0332997 | A1 | 11/2015 | Nakamura et al. | |

FOREIGN PATENT DOCUMENTS

| | | |
|---|---|---|
| JP | 2005217670 A | 8/2005 |
| JP | 2013058515 A | 3/2013 |
| JP | 2014146982 A | 8/2014 |
| JP | 2014154941 A | 8/2014 |
| KR | 1020070110957 A | 11/2007 |
| WO | 2010087304 A1 | 8/2010 |
| WO | 2014017228 A1 | 1/2014 |
| WO | 2014017514 A1 | 1/2014 |
| WO | 2014083908 A1 | 6/2014 |
| WO | 2017171991 A1 | 10/2017 |

OTHER PUBLICATIONS

Written Opinion issued in Application No. PCT/JP2018/045307, dated Jan. 8, 2019.

* cited by examiner

FIRST COMPARATIVE EXAMPLE

SECOND COMPARATIVE EXAMPLE

RADIO-FREQUENCY MODULE AND COMMUNICATION APPARATUS

This is a continuation of International Application No. PCT/JP2018/045307 filed on Dec. 10, 2018 which claims priority from Japanese Patent Application No. 2018-010666 filed on Jan. 25, 2018. The contents of these applications are incorporated herein by reference in their entireties.

BACKGROUND

The present disclosure relates to a radio-frequency module and a communication apparatus.

In mobile communication apparatuses, such as mobile phones, it is important to improve the signal quality of multiple frequency bands processed in radio-frequency front end circuits particularly with development of multiband technologies.

Japanese Unexamined Patent Application Publication No. 2013-058515 discloses a module in which multiple electronic components are mounted on one face or both faces of a wiring substrate and the electronic components are sealed with resin.

BRIEF SUMMARY

In the multiband radio-frequency front end circuit, multiple signal paths corresponding to the multiple frequency bands are provided and it is necessary to provide a switch circuit that switches transmission of radio-frequency signals on the multiple signal path.

However, when the multiband radio-frequency front end circuit is intended to be realized in the configuration of the module disclosed in Japanese Unexamined Patent Application Publication No. 2013-058515, it is necessary to arrange the multiple electronic components corresponding to the respective frequency bands on the wiring substrate with high density in consideration of the mounting of the above switch. In this case, radio-frequency coupling occurs in the lines in the wiring substrate to degrade isolation between the different signal paths. In addition, in exclusion of unnecessary coupling in the lines in the wiring substrate, the routing length of the lines is increased to increase propagation loss.

The present disclosure provides a multiband radio-frequency module and a multiband communication apparatus, which improve the isolation between the radio-frequency signals in different frequency bands and reduce the propagation loss of the radio-frequency signals.

A radio-frequency module according to an embodiment of the present disclosure includes a switch IC having a first main face and a second main face, which are arranged back to back, a first connection electrode arranged on the first main face, and a second connection electrode arranged on the second main face; at least one mounting substrate in or on which the switch IC is mounted and which has a first mounting face, which is a surface at the first main face side, and a second mounting face, which is a surface at the second main face side; a first signal line which is connected to the first connection electrode, which is formed at the first mounting face side of the at least one mounting substrate, and through which a radio-frequency signal in a first frequency band is transmitted; a second signal line which is connected to the second connection electrode, which is formed at the second mounting face side of the at least one mounting substrate, and through which a radio-frequency signal in a second frequency band different from the first frequency band is transmitted; at least one first electronic component connected to the first signal line; and at least one second electronic component connected to the second signal line. Only the at least one first electronic component, among the at least one first electronic component and the at least one second electronic component, is mounted on the first mounting face and only at least one second electronic component, among the at least one first electronic component and the at least one second electronic component, is mounted on the second mounting face.

With the above configuration, the first signal line and the first electronic component are formed at the first main face side and the second signal line and the second electronic component are formed at the second main face side. Accordingly, isolation between the radio-frequency signal in the first frequency band and the radio-frequency signal in the second frequency band is capable of being improved. In addition, since the arrangement of the connection electrodes for inputting and outputting the signals of the switch IC on both faces of the switch IC enables the first signal line to be formed at the first main face side and at the first mounting face side and enables the second signal line to be formed at the second main face side and the second mounting face side, the first signal line and the second signal line are capable of being shortened. Accordingly, it is possible to reduce propagation loss of the radio-frequency signals due to the wiring.

The switch IC may include a switch that switches between transmission and non-transmission of the radio-frequency signal in the first frequency band on the first signal line and between transmission and non-transmission of the radio-frequency signal in the second frequency band on the second signal line and a control circuit that supplies a control signal for switching between the connection and the non-connection to the switch.

With the above configuration, since the switch for switching between transmission and non-transmission of the radio-frequency signal in the first frequency band and between transmission and non-transmission of the radio-frequency signal in the second frequency band is arranged between the RF signal path for the first frequency band and the RF signal path for the second frequency band, the distance between the switch and the first signal line and the distance between the switch and the second signal line are capable of being further decreased. Accordingly, it is possible to reduce propagation loss of the radio-frequency signals due to the switch.

The transmission of the radio-frequency signal in the first frequency band on the first signal line and the transmission of the radio-frequency signal in the second frequency band on the second signal line may be concurrently performed through the switching of the switch.

With the above configuration, even when carrier aggregation (CA) of the radio-frequency signal in the first frequency band and the radio-frequency signal in the second frequency band is performed, it is possible to improve the isolation between the radio-frequency signal in the first frequency band and the radio-frequency signal in the second frequency band.

The at least one mounting substrate may be one mounting substrate having the first mounting face and the second mounting face, which are arranged back to back, and the switch IC may be mounted in the mounting substrate.

With the above configuration, since the switch IC is arranged in the mounting substrate, the distance between the first main face and the first mounting face and the distance between the second main face and the second mounting face are capable of being further decreased. Accordingly, both the first signal line and the second signal line are capable of being further shortened to further reduce the propagation loss of the radio-frequency signals due to the wiring.

The first mounting face and the at least one first electronic component may be covered with first resin, and the second mounting face and the at least one second electronic component may be covered with second resin.

With the above configuration, the weather resistance of the radio-frequency module is improved. In addition, since the switch IC, the mounting substrate, the first electronic component, and the second electronic component are fixed, mechanical strength is improved.

The at least one mounting substrate may be composed of a first mounting substrate having the first mounting face and a second mounting substrate having the second mounting face. The switch IC may be arranged between the first mounting substrate and the second mounting substrate, the first connection electrode may be joined to the first mounting substrate, and the second connection electrode may be joined to the second mounting substrate.

With the above configuration, since the first signal line and the second signal line are formed on the different mounting substrates, it is possible to further improve the isolation between the radio-frequency signal in the first frequency band and the radio-frequency signal in the second frequency band.

The first mounting face and the at least one first electronic component may be covered with first resin, the second mounting face and the at least one second electronic component may be covered with second resin, and the switch IC may be covered with third resin.

With the above configuration, the weather resistance of the radio-frequency module is improved. In addition, since the switch IC, the mounting substrates, the first electronic component, and the second electronic component are fixed, the mechanical strength is improved.

The at least one first electronic component may include a filter using the first frequency band as a pass band, and the at least one second electronic component may include a filter using the second frequency band as the pass band.

With the above configuration, the filter using the first frequency band as the pass band and the filter using the second frequency band as the pass band are arranged on the different mounting faces with the switch IC sandwiched therebetween. Accordingly, since interference of the radio-frequency signal in the first frequency band and the radio-frequency signal in the second frequency band upstream and downstream of the respective filters is capable of being suppressed, it is possible to suppress degradation of bandpass characteristics of the respective filters.

The at least one first electronic component may include a first amplifier that amplifies the radio-frequency signal in the first frequency band, and the at least one second electronic component may include a second amplifier that amplifies the radio-frequency signal in the second frequency band.

With the above configuration, the first amplifier and the second amplifier are arranged on the different mounting faces with the switch IC sandwiched therebetween. Accordingly, since the interference of the radio-frequency signal in the first frequency band and the radio-frequency signal in the second frequency band upstream and downstream of the respective amplifiers is capable of being suppressed, it is possible to suppress degradation of amplification characteristics of the respective amplifiers.

The at least one mounting substrate may be a multilayer substrate, and each of the first signal line and the second signal line may be composed of an intralayer line and an interlayer via line formed in the at least one mounting substrate.

With the above configuration, each of the first signal line and the second signal line is capable of being formed with a minimum path using the intralayer line and the interlayer via line. Consequently, it is possible to minimize the propagation loss of the radio-frequency signals due to the wiring.

The first frequency band may be any of Band 1, Band 66, and Band 34 in Long Term Evolution (LTE), and the second frequency band may be any of Band 3, Band 25, and Band 39 in the LTE.

With the above configuration, it is possible to improve the isolation between the signals in the configuration in which middle bands in the LTE are subjected to CA and non-CA to reduce the signal propagation loss.

The first frequency band may be Band 7 in the LTE, and the second frequency band may be Band 40 in the LTE.

With the above configuration, it is possible to improve the isolation between the signals in the configuration in which high bands in the LTE are subjected to CA and non-CA to reduce the signal propagation loss.

The first frequency band may be Band 8 or Band 26 in the LTE, and the second frequency band may be any of Band 20, Band 28, Band 12, Band 13, and Band 29 in the LTE.

With the above configuration, it is possible to improve the isolation between the signals in the configuration in which low bands in the LTE are subjected to CA and non-CA to reduce the signal propagation loss.

The first frequency band may be any of Band 1, Band 66, Band 34, Band 3, Band 25, and Band 39 in the LTE, and the second frequency band may be any of Band 7, Band 41, Band 30, and Band 40 in the LTE.

With the above configuration, it is possible to improve the isolation between the signals in the configuration in which the middle bands and the high bands in the LTE are subjected to CA and non-CA to reduce the signal propagation loss.

A communication apparatus according to an embodiment of the present disclosure includes an RF signal processing circuit that processes a RF signal transmitted and received through an antenna element and any of the radio-frequency modules, which transmits the radio-frequency signal between the antenna element and the RF signal processing circuit.

With the above configuration, it is possible to provide the multiband communication apparatus having improved isolation between the radio-frequency signal in the first frequency band and the radio-frequency signal in the second frequency band and reduced wiring propagation loss of the radio-frequency signals.

According to the present disclosure, it is possible to provide the multiband radio-frequency module and the multiband communication apparatus having improved isolation between the radio-frequency signals in the different frequency bands and reduced propagation loss of the radio-frequency signals.

Other features, elements, characteristics and advantages of the present disclosure will become more apparent from the following detailed description of embodiments of the present disclosure with reference to the attached drawings.

DETAILED DESCRIPTION

Figure 1:
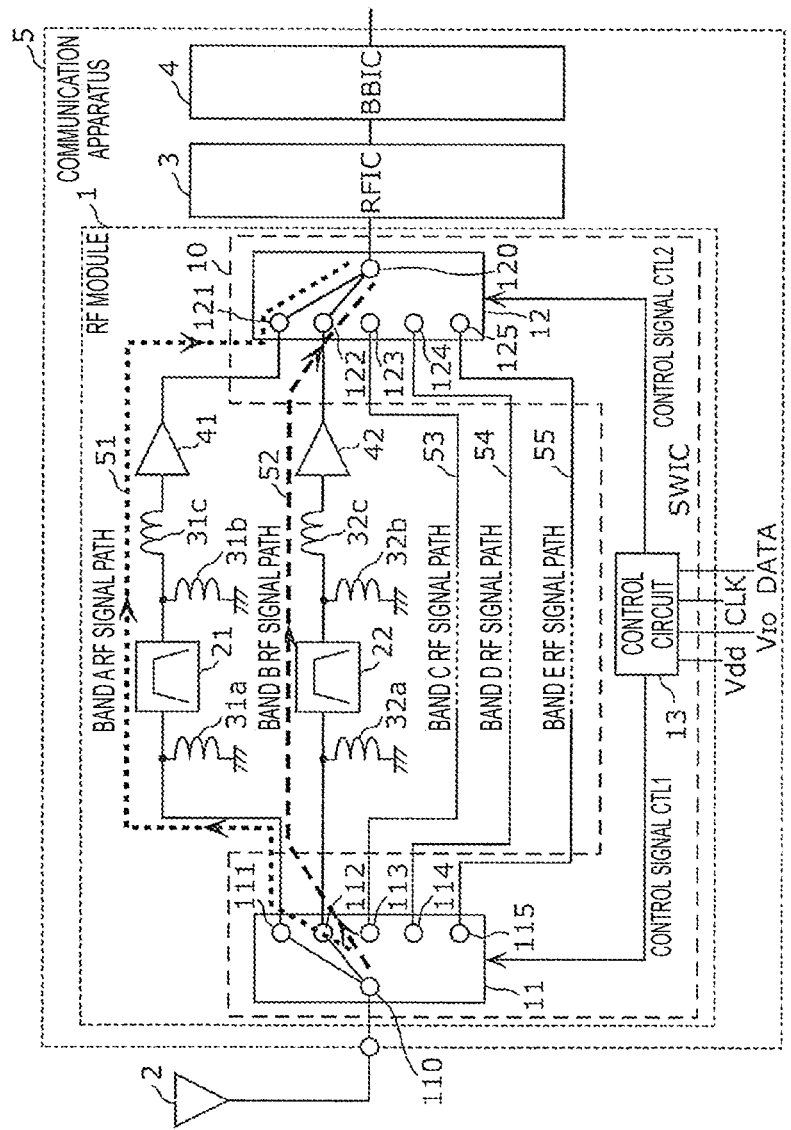
FIG. 1 is a functional block diagram of a communication apparatus according to a first embodiment and peripheral circuits.

Embodiments of the present disclosure will herein be described in detail using the embodiments with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. Among the components in the embodiments described below, the components that are not described in the independent claims are described as optional components. In addition, the sizes or the ratios of the sizes of the components illustrated in the drawings are not necessarily strictly indicated.

First Embodiment 1.1 Configuration of Communication Apparatus

FIG. 1 is a functional block diagram of a communication apparatus 5 according to a first embodiment and peripheral circuits. The communication apparatus 5 and an antenna element 2 are illustrated in FIG. 1. The communication apparatus 5 includes a radio-frequency (RF) module 1, an RF signal processing circuit (radio-frequency integrated circuit (RFIC)) 3, and a baseband signal processing circuit (baseband integrated circuit (BBIC)) 4. The RF module 1 is arranged in, for example, a front end unit of a multimode-multiband mobile phone. The RF module 1 composes a front end circuit capable of individually or concurrently propagating a band A radio-frequency reception signal, a band B radio-frequency reception signal, a band C radio-frequency reception signal, a band D radio-frequency reception signal, and a band E radio-frequency reception signal.

The RF module 1 includes a switch IC 10, filters 21 and 22, inductors 31a, 31b, 31c, 32a, 32b, and 32c, low noise amplifiers 41 and 42, and RF signal paths 51, 52, 53, 54, and 55.

The switch IC 10 is an active element including switches 11 and 12 and a control circuit 13.

The control circuit 13 is, for example, a digital control circuit. The control circuit 13 supplies a control signal CTL1 for switching between conduction and non-conduction of a common terminal and selection terminals of the switch 11 to the switch 11 via a control line and a control signal CTL2 for switching between conduction and non-conduction of a common terminal and selection terminals of the switch 12 to the switch 12 via a control line, based on a power signal Vdd, an input-output (IO) signal $V_{IO}$, a clock signal CLK, a data signal DATA, and so on, which are supplied from, for example, the RFIC 3. The control circuit 13 may further have a function to supply control signals for adjusting the amplification factors of the low noise amplifiers 41 and 42 to the low noise amplifiers 41 and 42.

Each of the switches 11 and 12 has a function to switch the propagation path of a radio-frequency signal supplied from the antenna element 2 to the RF module 1. The switch 11 is a switch circuit having a common terminal 110 and selection terminals 111, 112, 113, 114, and 115. With this configuration, the switch 11 switches between connection and non-connection of the common terminal 110 and the selection terminals 111 to 115 based on the control signal CTL1. The switch 12 is a switch circuit having a common terminal 120 and selection terminals 121, 122, 123, 124, and 125. With this configuration, the switch 12 switches between connection and non-connection of the common terminal 120 and the selection terminals 121 to 125 based on the control signal CTL2.

A configuration is illustrated in FIG. 1 in which the common terminal 110 is connected to the selection terminal 111, the common terminal 110 is connected to the selection terminal 112, the common terminal 120 is connected to the selection terminal 121, and the common terminal 120 is connected to the selection terminal 122 and in which the band A radio-frequency reception signal and the band B radio-frequency reception signal are concurrently received (carrier aggregation (CA)).

Multiple common terminals may be arranged as a configuration of the switch applied to the CA mode. In this case, multiple antenna elements may be arranged and multiple terminals of the RFIC 3, which are to be connected to the switch 12, may be arranged.

The filter 21 is a passive element using the band A (a first frequency band) as a pass band and corresponds to a first electronic component. The filter 22 is a passive element using the band B (a second frequency band) different from the band A as the pass band and corresponds to a second electronic component.

The inductor 31a is a passive element for achieving impedance matching between the antenna element 2 and the switch 11 and the filter 21 and corresponds to the first electronic component. The inductors 31b and 31c are passive elements for achieving the impedance matching between the filter 21 and the low noise amplifier 41 and correspond to the first electronic components.

The inductor 32a is a passive element for achieving the impedance matching between the antenna element 2 and the switch 11 and the filter 22 and corresponds to the second electronic component. The inductors 32b and 32c are passive elements for achieving the impedance matching between the filter 22 and the low noise amplifier 42 and correspond to the second electronic components.

The low noise amplifier 41 is a first amplifier that amplifies the band A radio-frequency reception signal input into the RF module 1. The low noise amplifier 42 is a second amplifier that amplifies the band B radio-frequency reception signal input into the RF module 1.

The RF signal path 51 is a path through which the band A radio-frequency reception signal is selectively transmitted and is composed of a first signal line.

The RF signal path 52 is a path through which the radio-frequency reception signal of the band B, which is different from the band A, is selectively transmitted and is composed of a second signal line.

The RF signal path 53 is a path through which the radio-frequency reception signal of the band C, which is different from the bands A and B, is selectively transmitted. The RF signal path 54 is a path through which the radio-frequency reception signal of the band D, which is different from the bands A, B, and C, is selectively transmitted. The RF signal path 55 is a path through which the radio-frequency reception signal of the band E, which is different from the bands A, B, C, and D, is selectively transmitted.

Although the electronic components including the filters, the amplifiers, and the inductors, which are arranged on the RF signal paths 53 to 55, are omitted in FIG. 1, the electronic components including the filters, the amplifiers, and the inductors are arranged on the RF signal paths 53 to 55, as on the RF signal paths 51 and 52.

With the above configuration, the RF module 1 is capable of transmitting the band A radio-frequency reception signal, the band B radio-frequency reception signal, the band C radio-frequency reception signal, the band D radio-frequency reception signal, and the band E radio-frequency reception signal through the switching operation of the switch IC 10. The RF module 1 is applicable to a (non-CA) mode in which the reception signals in the five frequency bands are individually transmitted and a (CA) mode in which two reception signals, among the reception signals in the five frequency bands, are concurrently transmitted.

Although the RF module 1, which is a reception demultiplexer circuit, is exemplified as the radio-frequency module in the first embodiment, the radio-frequency module of the present disclosure may be a transmission multiplexer circuit or may be a demultiplexer-multiplexer circuit capable of both transmission and reception. In addition, the number of frequency bands (signal paths) is not limited.

The filter 21, the inductors 31a, 31b, and 31c, and the low noise amplifier 41 are optional components for propagating the band A radio-frequency signal on the RF signal path 51. The filter 22, the inductors 32a, 32b, and 32c, and the low noise amplifier 42 are optional components for propagating the band B radio-frequency signal on the RF signal path 52. Electronic components including capacitors and resistance elements may be arranged, in addition to the above components or instead of the above components.

The RF signal processing circuit (RFIC) 3 performs signal processing, such as down-conversion, to the radio-frequency reception signal supplied from the antenna element 2 through the RF module 1 and supplies the reception signal resulting from the signal processing to the baseband signal processing circuit (BBIC) 4.

The baseband signal processing circuit (BBIC) 4 is a circuit that performs signal processing using an intermediate frequency band lower than the frequency of the radio-frequency signal in the front end unit. The signal processed in the baseband signal processing circuit (BBIC) 4 is used as, for example, an image signal for image display or an audio signal for talking with a speaker.

1.2 Structure of RF Module

Figure 2:
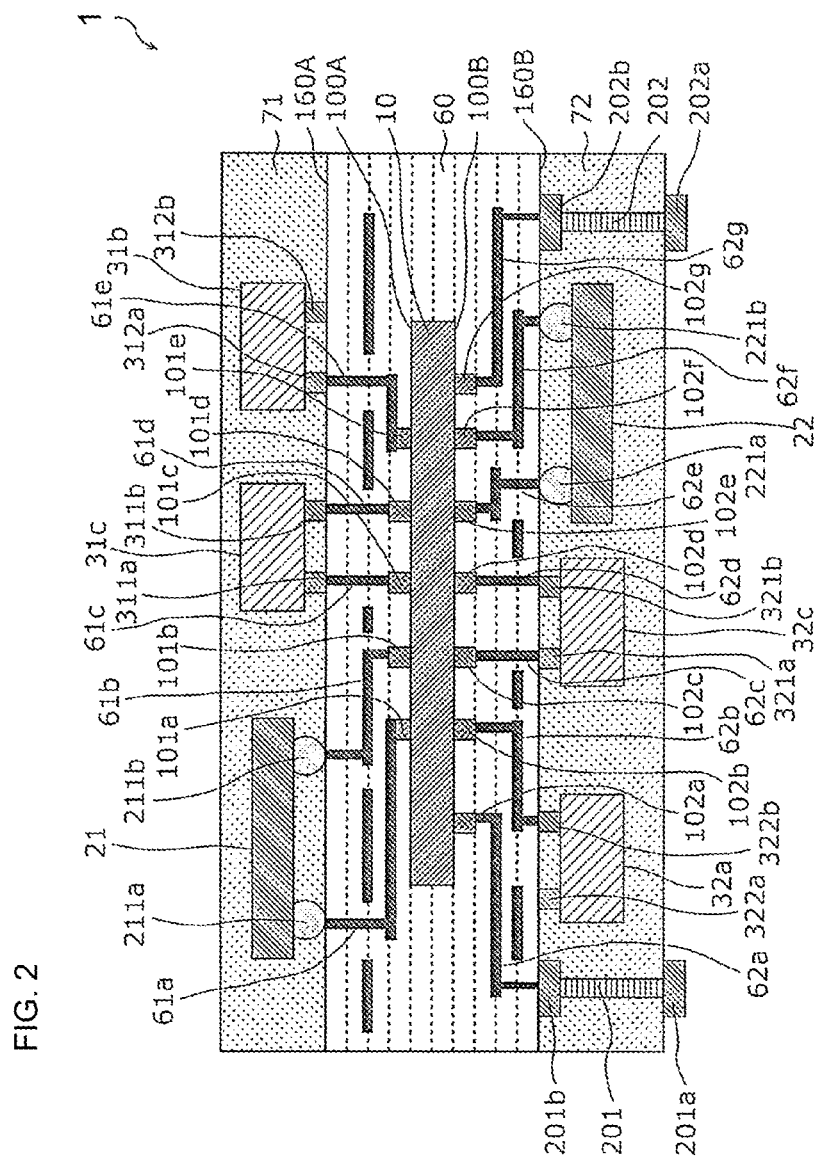
FIG. 2 is a cross-sectional configuration diagram of a radio-frequency module according to the first embodiment.

The structure of the RF module 1 according to the first embodiment will now be described. FIG. 2 is a cross-sectional configuration diagram of the RF module 1 according to the first embodiment. As illustrated in FIG. 2, the RF module 1 includes the switch IC 10, a mounting substrate 60, signal lines 61a, 61b, 61c, 61d, and 61e, signal lines 62a, 62b, 62c, 62d, 62e, 62f, and 62g, the filters 21 and 22, and the inductors 31b, 31c, 32a, and 32c.

The RF module 1 further includes the inductors 31a and 32b illustrated in FIG. 1 although not illustrated in the cross-sectional view in FIG. 2.

The switch IC 10 has a first main face 100A and a second main face 100B, which are arranged back to back, and connection electrodes 101a, 101b, 101c, 101d, 101e, 102a, 102b, 102c, 102d, 102e, 102f, and 102g. The connection electrodes 101a to 101e are first connection electrodes arranged on the first main face 100A and the connection electrodes 102a to 102g are second connection electrodes arranged on the second main face 100B.

The mounting substrate 60 has a first mounting face 160A, which is the surface at the first main face 100A side, and a second mounting face 160B, which is the surface at the second main face 100B side. The switch IC 10 is mounted in the mounting substrate 60. The mounting substrate 60 is a multilayer substrate in which multiple layers are laminated. The mounting substrate 60 is, for example, a ceramic multilayer substrate or a printed circuit board (PCB) substrate.

In the present specification, the "first main face side" indicates the direction in which the first main face exists with reference to the center of the switch IC and does not indicate the first main face itself. The "second main face side" indicates the direction in which the second main face exists with reference to the center of the switch IC and does not indicate the second main face itself.

The signal line 61a is connected to the connection electrode 101a, the signal line 61b is connected to the connection electrode 101b, the signal line 61c is connected to the connection electrode 101c, the signal line 61d is connected to the connection electrode 101d, and the signal line 61e is connected to the connection electrode 101e. The signal lines 61a to 61e are the first signal lines which are formed at the first mounting face 160A side of the mounting substrate 60 and through which only the radio-frequency signal of the band A, among the band A (the first frequency band) and the band B (the second frequency band), is transmitted.

The signal line 62a is connected to the connection electrode 102a, the signal line 62b is connected to the connection electrode 102b, the signal line 62c is connected to the connection electrode 102c, the signal line 62d is connected to the connection electrode 102d, the signal line 62e is connected to the connection electrode 102e, the signal line 62f is connected to the connection electrode 102f, and the signal line 62g is connected to the connection electrode 102g. The signal lines 62b to 62f are the second signal lines which are formed at the second mounting face 160B side of the mounting substrate 60 and through which only the radio-frequency signal of the band B, among the band A (the first frequency band) and the band B (the second frequency band), is transmitted.

The filter 21 is the first electronic component having input-output terminals 211a and 211b. The input-output terminal 211a is connected to the connection electrode 101a and the input-output terminal 211b is connected to the connection electrode 101b.

The inductor 31c is the first electronic component having input-output terminals 311a and 311b. The input-output terminal 311a is connected to the connection electrode 101c and the input-output terminal 311b is connected to the connection electrode 101d.

The inductor 31b is the first electronic component having input-output terminals 312a and 312b. The input-output terminal 312a is connected to the connection electrode 101e.

The inductor 31a is the first electronic component and the inductor 32b is the second electronic component.

The filter 22 is the second electronic component having input-output terminals 221a and 221b. The input-output terminal 221a is connected to the connection electrode 102e and the input-output terminal 221b is connected to the connection electrode 102f.

The inductor 32a is the second electronic component having input-output terminals 322a and 322b. The input-output terminal 322b is connected to the connection electrode 102b.

The inductor 32c is the second electronic component having input-output terminals 321a and 321b. The input-output terminal 321a is connected to the connection electrode 102c and the input-output terminal 321b is connected to the connection electrode 102d.

In the RF module 1 having the above configuration, among the multiple first electronic components (the filter 21 and the inductors 31a to 31c) and the multiple second electronic components (the filter 22 and the inductors 32a to 32c), only the multiple first electronic components are mounted on the first mounting face 160A. Among the multiple first electronic components (the filter 21 and the inductors 31a to 31c) and the multiple second electronic components (the filter 22 and the inductors 32a to 32c), only the multiple second electronic components are mounted on the second mounting face 160B.

With the above configuration, the first signal lines (the signal lines 61a to 61e) and the first electronic components (the filter 21 and the inductors 31a to 31c) are formed at the first main face 100A side and the second signal lines (the signal lines 62b to 62f) and the second electronic components (the filter 22 and the inductors 32a to 32c) are formed at the second main face 100B side. Accordingly, it is possible to improve isolation between the radio-frequency signal in the first frequency band (the band A) and the radio-frequency signal in the second frequency band (the band B). In addition, since separately arranging the connection electrodes 101a to 101e and the connection electrodes 102a to 102g for inputting and outputting the signals of the switch IC 10 on both faces of the switch IC 10 enables the first signal lines to be formed at the first main face 100A side and at the first mounting face 160A side and enables the second signal lines to be formed at the second main face 100B side and at the second mounting face 160B side, the first signal lines and the second signal lines are capable of being shortened. Accordingly, it is possible to reduce propagation loss of the radio-frequency signals due to the wiring.

Since the switch IC 10 for switching between transmission and non-transmission of the radio-frequency signal in the first frequency band (the band A) and between transmission and non-transmission of the radio-frequency signal in the second frequency band (the band B) is arranged between the RF signal path 51 for the first frequency band and the RF signal path 52 for the second frequency band, the distance between the switch IC 10 and the first signal lines and the distance between the switch IC 10 and the second signal lines are capable of being further decreased. Accordingly, it is possible to reduce propagation loss of the radio-frequency signals due to the switch.

Even when the CA of the radio-frequency signal in the first frequency band and the radio-frequency signal in the second frequency band is performed, it is possible to improve the isolation between the radio-frequency signal in the first frequency band and the radio-frequency signal in the second frequency band.

Since the switch IC 10 is arranged in the mounting substrate 60 in the first embodiment, the distance between the first main face 100A and the first mounting face 160A and the distance between the second main face 100B and the second mounting face 160B are capable of being further decreased. Accordingly, both the first signal lines and the second signal lines are capable of being further shortened to further reduce the propagation loss of the radio-frequency signals due to the wiring.

The filter 21 using the first frequency band as the pass band and the filter 22 using the second frequency band as the pass band are arranged on the different mounting faces with the switch IC 10 sandwiched therebetween. Accordingly, since interference of the radio-frequency signal in the first frequency band and the radio-frequency signal in the second frequency band on the RF signal paths upstream and downstream of the respective filters is capable of being suppressed, it is possible to suppress degradation of bandpass characteristics of the filters 21 and 22.

When the RF module 1 includes the low noise amplifiers 41 and 42 illustrated in FIG. 1, the low noise amplifier 41 can be mounted on the first mounting face 160A and the low noise amplifier 42 can be mounted on the second mounting face 160B.

With this configuration, the low noise amplifier 41 and the low noise amplifier 42 are arranged on the different mounting faces with the switch IC 10 sandwiched therebetween. Accordingly, since the interference of the radio-frequency signal in the band A and the radio-frequency signal in the band B upstream and downstream of the respective low noise amplifiers is capable of being suppressed, it is possible to suppress degradation of amplification characteristics of the low noise amplifiers 41 and 42.

When the RF module 1 includes the low noise amplifiers 41 and 42 illustrated in FIG. 1, the low noise amplifiers 41 and 42 may be mounted on a substrate different from the mounting substrate 60.

As illustrated in FIG. 2, the first signal lines (the signal lines 61a to 61e) and the second signal lines (the signal lines 62b to 62f) are composed of intralayer lines and interlayer via lines formed in the mounting substrate 60. Accordingly, the first signal lines and the second signal lines are capable of being formed with minimum paths using the intralayer lines and the interlayer via lines. Consequently, it is possible to minimize the propagation loss of the radio-frequency signals due to the wiring.

The RF module 1 further includes resin 71 (first resin) with which the first mounting face 160A and the first electronic components (the filter 21 and the inductors 31a to 31c) are covered and resin 72 (second resin) with which the second mounting face 160B and the second electronic components (the filter 22 and the inductors 32a to 32c) are covered.

Accordingly, the weather resistance of the RF module 1 is improved. In addition, since the switch IC 10, the mounting substrate 60, the first electronic components, and the second electronic components are fixed, mechanical strength is improved.

The RF module 1 further has external connection electrodes 201a and 202a for inputting and outputting the radio-frequency signal, which are formed on a surface of the resin 72. The external connection electrode 201a is connected to a connection electrode 201b formed on the second mounting face 160B with a substantially columnar electrode 201 formed so as to pass through the resin 72. The connection electrode 201b is connected to the signal line 62a. The external connection electrode 202a is connected to a connection electrode 202b formed on the second mounting face 160B with a substantially columnar electrode 202 formed so as to pass through the resin 72. The connection electrode 202b is connected to the signal line 62g.

Figure 3:
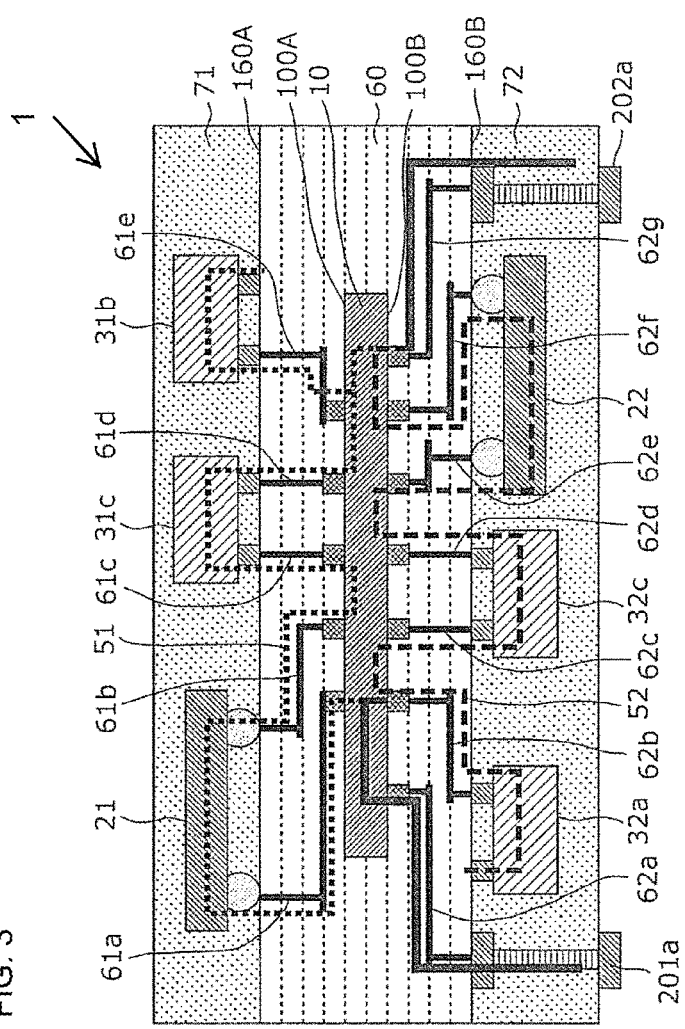
FIG. 3 is a cross-sectional configuration diagram illustrating the signal transmission state in the radio-frequency module according to the first embodiment.

FIG. 3 is a cross-sectional configuration diagram illustrating the signal transmission state in the RF module 1 according to the first embodiment. The band A radio-frequency signal is input through the external connection electrode 201*a* and is output from the external connection electrode 202*a* through the RF signal path 51 illustrated in FIG. 3. The band B radio-frequency signal is input through the external connection electrode 201*a* and is output from the external connection electrode 202*a* through the RF signal path 52 illustrated in FIG. 3.

As illustrated in FIG. 3, the RF signal path 51 is composed of the first signal lines (the signal lines 61*a* to 61*e*) formed at the first mounting face 160A side of the mounting substrate 60 and the first electronic components (the filter 21 and the inductors 31*a* to 31*c*) mounted on the first mounting face 160A, and the RF signal path 51 is not formed at the second mounting face 160B side of the mounting substrate 60. In contrast, the RF signal path 52 is composed of the second signal lines (the signal lines 62*b* to 62*f*) formed at the second mounting face 160B side of the mounting substrate 60 and the second electronic components (the filter 22 and the inductors 32*a* to 32*c*) mounted on the second mounting face 160B, and the RF signal path 52 is not formed at the first mounting face 160A side of the mounting substrate 60.

Figure 4A:
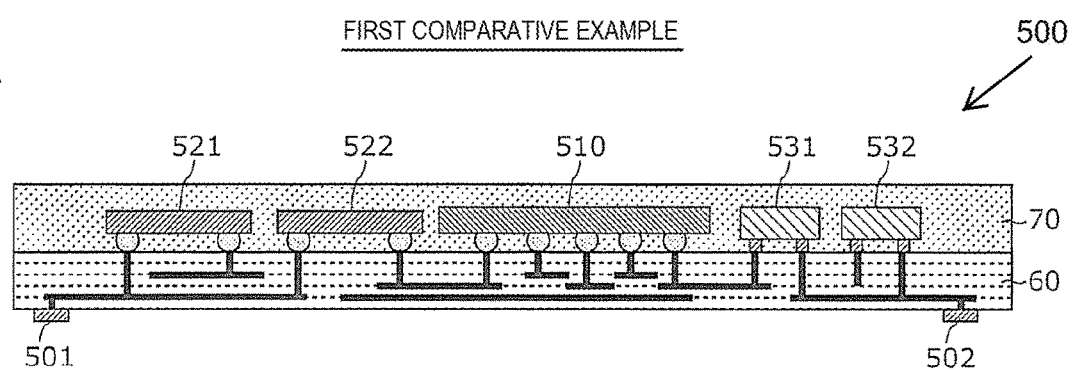
FIG. 4A is a cross-sectional configuration diagram of a radio-frequency module according to a first comparative example.

1.3 Comparison Between RF Modules According to First Embodiment and Comparative Example FIG. 4A is a cross-sectional configuration diagram of an RF module 500 according to a first comparative example. As illustrated in FIG. 4A, the RF module 500 according to the first comparative example includes a switch IC 510, the mounting substrate 60, filters 521 and 522, inductors 531 and 532, external connection electrodes 501 and 502, resin 70, and the signal lines formed in the mounting substrate 60.

The switch IC 510 includes a switch and a control circuit and has multiple connection electrodes only on one face.

The mounting substrate 60 has a mounting face and a rear face and the switch IC 510 is mounted on the mounting face.

The signal lines formed in the mounting substrate 60 are connected to the connection electrodes of the switch IC 510, input-output terminals of the filters 521 and 522 and the inductors 531 and 532, and the external connection electrodes 501 and 502.

The filter 521 is a filter using the band A as the pass band and corresponds to the first electronic component. The filter 522 is a filter using the band B as the pass band and corresponds to the second electronic component.

The inductor 531 is a passive element for achieving the impedance matching between the switch and the filter 521 and corresponds to the first electronic component. The inductor 532 is a passive element for achieving the impedance matching between the switch and the filter 522 and corresponds to the second electronic component.

In the RF module 500 having the above configuration, the multiple first electronic components (the filter 521 and the inductor 531) and the multiple second electronic components (the filter 522 and the inductor 532) are mounted on the mounting face due to the arrangement of the connection electrodes of the switch IC 510 only on one face.

Figure 4B:
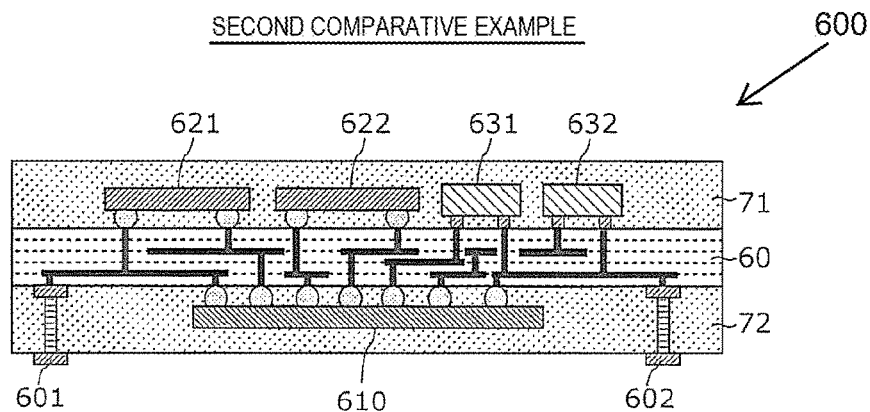
FIG. 4B is a cross-sectional configuration diagram of a radio-frequency module according to a second comparative example.

FIG. 4B is a cross-sectional configuration diagram of an RF module 600 according to a second comparative example. As illustrated in FIG. 4B, the RF module 600 according to the second comparative example includes a switch IC 610, the mounting substrate 60, filters 621 and 622, inductors 631 and 632, external connection electrodes 601 and 602, the resins 71 and 72, and the signal lines formed in the mounting substrate 60.

The switch IC 610 includes a switch and a control circuit and has multiple connection electrodes only on one face.

The mounting substrate 60 has the first mounting face and the second mounting face. The filters 621 and 622 and the inductors 631 and 632 are mounted on the first mounting face and the switch IC 610 is mounted on the second mounting face.

The signal lines formed in the mounting substrate 60 are connected to the connection electrodes of the switch IC 610, input-output terminals of the filters 621 and 622 and the inductors 631 and 632, and the external connection electrodes 601 and 602.

The filter 621 is a filter using the band A as the pass band and corresponds to the first electronic component. The filter 622 is a filter using the band B as the pass band and corresponds to the second electronic component.

The inductor 631 is a passive element for achieving the impedance matching between the switch and the filter 621 and corresponds to the first electronic component. The inductor 632 is a passive element for achieving the impedance matching between the switch and the filter 622 and corresponds to the second electronic component.

In the RF module 600 having the above configuration, the multiple first electronic components (the filter 621 and the inductor 631) and the multiple second electronic components (the filter 622 and the inductor 632) are mounted on the first mounting face due to the arrangement of the connection electrodes of the switch IC 610 only on one face.

In each of the RF module 500 according to the first comparative example and the RF module 600 according to the second comparative example described above, the first electronic components and the second electronic components are intensively mounted on the mounting face at one side of the mounting substrate 60 due to the arrangement of the connection electrodes of the switch IC only on one face. Accordingly, the signal lines formed in the mounting substrate 60 are formed with high density. In this case, the signal line through which the band A radio-frequency signal is transmitted and the signal line through which the band B radio-frequency signal is transmitted may adjacently run side by side or may be closely opposed to each other in the mounting substrate 60. Accordingly, radio-frequency coupling occurs between the band A signal line and the band B signal line to degrade the isolation between the band A signal line and the band B signal line. In addition, in exclusion of unnecessary coupling in the signal lines in the mounting substrate 60, the routing length of the signal lines is increased to increase the propagation loss due to the signal lines.

In contrast, with the RF module 1 according to the first embodiment, the first signal lines (the signal lines 61*a* to 61*e*) and the first electronic components (the filter 21 and the inductors 31*a* to 31*c*) are formed at the first main face 100A side and the second signal lines (the signal lines 62*b* to 62*f*) and the second electronic components (the filter 22 and the inductors 32*a* to 32*c*) are formed at the second main face 100B side. Accordingly, compared with the RF module 500 according to the first comparative example and the RF module 600 according to the second comparative example, the isolation between the first signal lines and the second signal lines is capable of being improved. In addition, separately arranging the connection electrodes 101*a* to 101*e* and the connection electrodes 102*a* to 102*g* for inputting and outputting the signals of the switch IC 10 on both faces of the switch IC 10 enables the first signal lines and the second signal lines to be shortened. Accordingly, it is possible to reduce the propagation loss of the radio-frequency signals due to the wiring, compared with the RF module 500 according to the first comparative example and the RF module 600 according to the second comparative example.

Second Embodiment

The switch IC is mounted in the mounting substrate in the first embodiment while an RF module in which the switch IC is surface-mounted on the mounting substrate will be described in a second embodiment. Since the circuit configuration of an RF module 1A according to the second embodiment is the same as the circuit configuration of the RF module 1 illustrated in FIG. 1, a description of the circuit configuration of the RF module 1A according to the second embodiment is omitted herein.

2.1 Structure of RF Module

Figure 5:
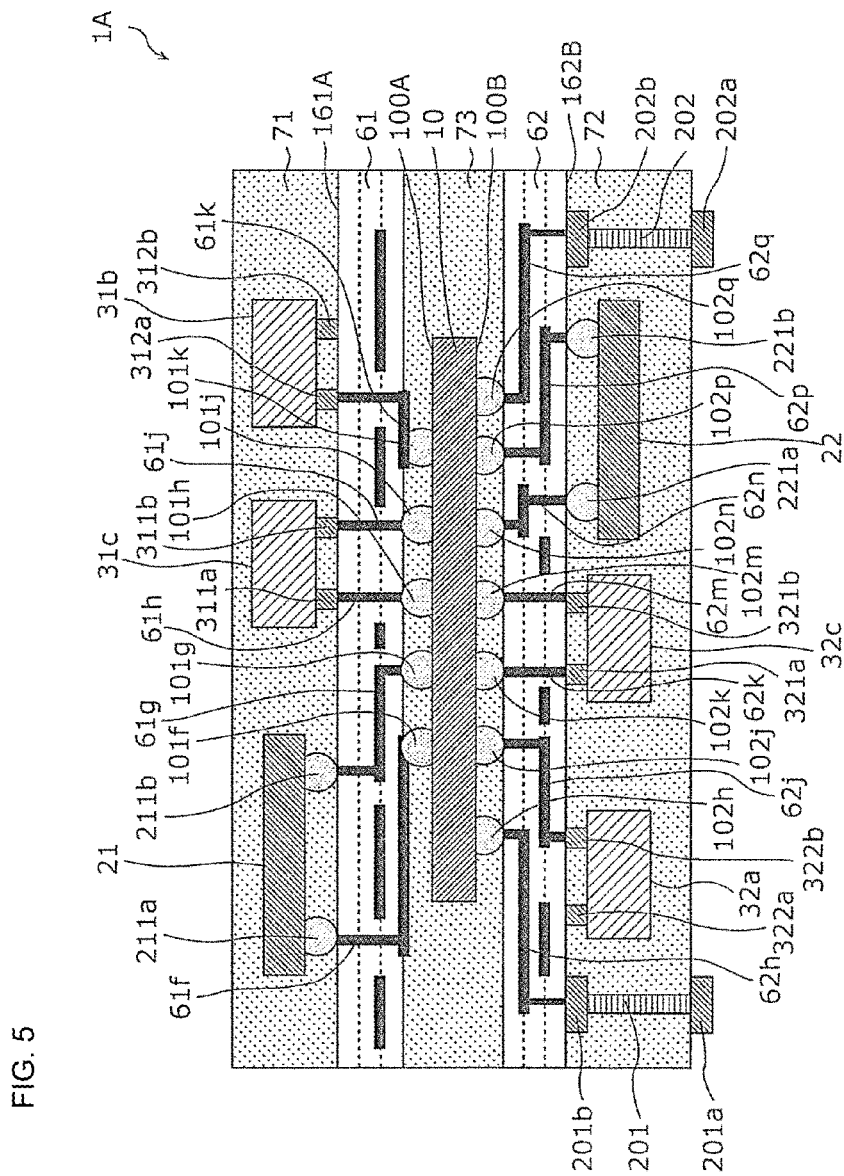
FIG. 5 is a cross-sectional configuration diagram of a radio-frequency module according to a second embodiment

The structure of the RF module 1A according to the second embodiment will now be described. FIG. 5 is a cross-sectional configuration diagram of the RF module 1A according to the second embodiment. As illustrated in FIG. 5, the RF module 1A includes the switch IC 10, mounting substrates 61 and 62, signal lines 61f, 61g, 61h, 61j, and 61k, signal lines 62h, 62j, 62k, 62m, 62n, 62p, and 62q, the filters 21 and 22, and the inductors 31b, 31c, 32a, and 32c.

The RF module 1A further includes the inductors 31a and 32b illustrated in FIG. 1 although not illustrated in the cross-sectional view in FIG. 5.

The RF module 1A according to the second embodiment differs from the RF module 1 according to the first embodiment as the configuration in that the switch IC 10 is surface-mounted on the mounting substrates and in that the RF module 1A includes the two mounting substrates 61 and 62. A description of the same points of the RF module 1A according to the second embodiment as in the RF module 1 according to the first embodiment is omitted and the RF module 1A according to the second embodiment will be described, focusing on the points different from the RF module 1 according to the first embodiment.

The switch IC 10 has the first main face 100A and the second main face 100B, which are arranged back to back, and connection electrodes 101f, 101g, 101h, 101j, 101k, 102h, 102j, 102k, 102m, 102n, 102p, and 102q. The connection electrodes 101f to 101k are the first connection electrodes arranged on the first main face 100A and the connection electrodes 102h to 102q are the second connection electrodes arranged on the second main face 100B.

The mounting substrate 61 is a first mounting substrate having a first mounting face 161A arranged at the first main face 100A side of the switch IC 10. The mounting substrate 62 is a second mounting substrate having a second mounting face 162B arranged at the second main face 100B side of the switch IC 10. Each of the mounting substrates 61 and 62 is a multilayer substrate in which multiple layers are laminated. Each of the mounting substrates 61 and 62 is, for example, a ceramic multilayer substrate or a PCB substrate.

The switch IC 10 is arranged between the mounting substrate 61 and the mounting substrate 62. The connection electrodes 101f to 101k are joined to the mounting substrate 61 and the connection electrodes 102h to 102q are joined to the mounting substrate 62.

The signal line 61f is connected to the connection electrode 101f, the signal line 61g is connected to the connection electrode 101g, the signal line 61h is connected to the connection electrode 101h, the signal line 61j is connected to the connection electrode 101j, and the signal line 61k is connected to the connection electrode 101k. The signal lines 61f to 61k are the first signal lines which are formed in the mounting substrate 61 (at the first mounting face 161A side, among the first mounting face 161A and the second mounting face 162B) and through which only the radio-frequency signal of the band A, among the band A (the first frequency band) and the band B (the second frequency band), is transmitted.

The signal line 62h is connected to the connection electrode 102h, the signal line 62j is connected to the connection electrode 102j, the signal line 62k is connected to the connection electrode 102k, the signal line 62m is connected to the connection electrode 102m, the signal line 62n is connected to the connection electrode 102n, the signal line 62p is connected to the connection electrode 102p, and the signal line 62q is connected to the connection electrode 102q. The signal lines 62j to 62p are the second signal lines which are formed in the mounting substrate 62 (at the second mounting face 162B side, among the first mounting face 161A and the second mounting face 162B) and through which only the radio-frequency signal of band B, among the band A and the band B, is transmitted.

The filter 21 is the first electronic component having the input-output terminals 211a and 211b. The input-output terminal 211a is connected to the connection electrode 101f and the input-output terminal 211b is connected to the connection electrode 101g.

The inductor 31c is the first electronic component having the input-output terminals 311a and 311b. The input-output terminal 311a is connected to the connection electrode 101h and the input-output terminal 311b is connected to the connection electrode 101j.

The inductor 31b is the first electronic component having the input-output terminals 312a and 312b. The input-output terminal 312a is connected to the connection electrode 101k.

The inductor 31a is the first electronic component and the inductor 32b is the second electronic component.

The filter 22 is the second electronic component having the input-output terminals 221a and 221b. The input-output terminal 221a is connected to the connection electrode 102n and the input-output terminal 221b is connected to the connection electrode 102p.

The inductor 32a is the second electronic component having the input-output terminals 322a and 322b. The input-output terminal 322b is connected to the connection electrode 102j.

The inductor 32c is the second electronic component having the input-output terminals 321a and 321b. The input-output terminal 321a is connected to the connection electrode 102k and the input-output terminal 321b is connected to the connection electrode 102m.

In the RF module 1A having the above configuration, among the multiple first electronic components (the filter 21 and the inductors 31a to 31c) and the multiple second electronic components (the filter 22 and the inductors 32a to 32c), only the multiple first electronic components are mounted on the first mounting face 161A. Among the multiple first electronic components (the filter 21 and the inductors 31a to 31c) and the multiple second electronic components (the filter 22 and the inductors 32a to 32c), only the multiple second electronic components are mounted on the second mounting face 162B.

With the above configuration, the first signal lines (the signal lines 61f to 61k) and the first electronic components (the filter 21 and the inductors 31a to 31c) are formed at the first main face 100A side and the second signal lines (the signal lines 62j to 62p) and the second electronic components (the filter 22 and the inductors 32a to 32c) are formed at the second main face 100B side. Accordingly, the isolation between the radio-frequency signal in the first frequency band (the band A) and the radio-frequency signal in the second frequency band (the band B) is capable of being improved. In addition, since separately arranging the connection electrodes 101f to 101k and the connection electrodes 102h to 102q for inputting and outputting the signals of the switch IC 10 on both faces of the switch IC 10 enables the first signal lines to be formed at the first main face 100A side and at the first mounting face 161A side and enables the second signal lines to be formed at the second main face 100B side and at the second mounting face 162B side, the first signal lines and the second signal lines are capable of being shortened. Accordingly, it is possible to reduce the propagation loss of the radio-frequency signals due to the wiring.

Since the switch IC 10 is arranged between the mounting substrate 61 and the mounting substrate 62 and the first signal lines and the second signal lines are formed on the different mounting substrates in the second embodiment, it is possible to further improve the isolation between the radio-frequency signal in the first frequency band (the band A) and the radio-frequency signal in the second frequency band (the band B).

The RF module 1A further includes the resin 71 (the first resin) with which the first mounting face 161A and the first electronic components (the filter 21 and the inductors 31a to 31c) are covered, the resin 72 (the second resin) with which the second mounting face 162B and the second electronic components (the filter 22 and the inductors 32a to 32c) are covered, and resin 73 (third resin) with which the switch IC 10 is covered.

Accordingly, the weather resistance of the RF module 1A is improved. In addition, since the switch IC 10, the mounting substrates 61 and 62, the first electronic components, and the second electronic components are fixed, the mechanical strength is improved.

Other Embodiments

Although the radio-frequency modules (the RF modules) and the communication apparatus according to the embodiments of the present disclosure are described above, the radio-frequency module and the communication apparatus according to the present disclosure are not limited to the embodiments described above. Other embodiments realized by combining arbitrary components in the above embodiments, modifications realized by making various changes supposed by a person skilled in the art to the above embodiments without necessarily departing from the spirit and scope of the present disclosure, and various devices including the radio-frequency module and the communication apparatus are also included in the present disclosure.

For example, in the radio-frequency modules and the communication apparatus according to the embodiments described above, other circuit elements, lines, and so on may be provided between the paths connecting the respective circuit elements and the signal paths disclosed in the drawings.

In the radio-frequency modules according to the above embodiments, shielding members may be formed on the resins with which the first electronic components and the second electronic components are sealed. The shielding members may be formed not only on the mounting faces of the mounting substrate(s) or the upper faces of the resins but also on side faces of the mounting substrate(s) or side face of the resins. Instead of the shielding members formed on the side faces of the resins, connection conductors formed so as to pass through the resins may be provided in the resins near the side faces.

The switch IC 10 may be composed of complementary metal oxide semiconductor (CMOS). In this case, it is possible to manufacture the switch IC 10 inexpensively.

The switch IC 10 may be made of GaAs. In this case, it is possible to generate a high-quality digital control signal to output the radio-frequency signal having high-quality amplification performance and noise performance.

The switch IC 10 in the embodiments of the present disclosure may be realized by large scale integration (LSI), which is an integrated circuit. The integrated circuit may be realized by a dedicated circuit or a general-purpose processor. After manufacturing the LSI, a field programmable gate array (FPGA), which is programmable, or a reconfigurable processor, in which connection or setting of circuit cells in the LSI are reconfigurable, may be used. In addition, the functional blocks may be integrated using a technology to realize the integrated circuit, with which the LSI is replaced, if the technology appears owing to progress of the semiconductor technology or other derived technologies.

Each of the RF module 1 according to the first embodiment and the RF module 1A according to the second embodiment is applied as the radio-frequency module that demultiplexes or multiplexes the radio-frequency signals in the frequency bands in any of (1) to (4) described below in Long Term Evolution (LTE).

(1) The first frequency band (the band A) is any of Band 1 (transmission band: about 1,920 MHz to about 1,980 MHz and reception band: about 2,110 MHz to about 2,170 MHz), Band 66 (transmission band: about 1,710 MHz to about 1,780 MHz and reception band: about 2,110 MHz to about 2,200 MHz), and Band 34 (transmission-reception band: about 2,010 MHz to about 2,025 MHz) in the LTE. The second frequency band (the band B) is any of Band 3 (transmission band: about 1,710 MHz to about 1,785 MHz and reception band: about 1,805 MHz to about 1,880 MHz), Band 25 (transmission band: about 1,850 MHz to about 1,915 MHz and reception band: about 1,930 MHz to about 1,995 MHz), and Band 39 (transmission-reception band: about 1,880 MHz to about 1,920 MHz) in the LTE. In this case, it is possible to improve the isolation between the signals in the configuration in which middle bands in the LTE are subjected to CA and non-CA to reduce the signal propagation loss.

(2) The first frequency band (the band A) is Band 7 (transmission band: about 2,500 MHz to about 2,570 MHz and reception band: about 2,620 MHz to about 2,690 MHz) in the LTE. The second frequency band (the band B) is Band 40 (transmission-reception band: about 2,300 MHz to about 2,400 MHz) in the LTE. In this case, it is possible to improve the isolation between the signals in the configuration in which high bands in the LTE are subjected to CA and non-CA to reduce the signal propagation loss.

(3) The first frequency band (the band A) is Band 8 (transmission band: about 880 MHz to about 915 MHz and reception band: about 925 MHz to about 960 MHz) or Band 26 (transmission band: about 814 MHz to about 849 MHz and reception band: about 859 MHz to about 894 MHz) in the LTE. The second frequency band (the band B) is any of Band 20 (transmission band: about 832 MHz to about 862 MHz and reception band: about 791 MHz to about 821 MHz), Band 28 (transmission band: about 703 MHz to about 748 MHz and reception band: about 758 MHz to about 803 MHz), Band 12 (transmission band: about 699 MHz to about 716 MHz and reception band: about 729 MHz to about 746

MHz), Band 13 (transmission band: about 777 MHz to about 787 MHz and reception band: about 746 MHz to about 756 MHz), and Band 29 (reception band: about 717 MHz to about 728 MHz) in the LTE. In this case, it is possible to improve the isolation between the signals in the configuration in which low bands in the LTE are subjected to CA and non-CA to reduce the signal propagation loss.

(4) The first frequency band (the band A) is any of Band 1, Band 66, Band 34, Band 3, Band 25, and Band 39 in the LTE. The second frequency band (the band B) is any of Band 7, Band 41 (transmission-reception band: about 2,496 MHz to about 2,690 MHz), Band 30 (transmission band: about 2,305 MHz to about 2,315 MHz and reception band: about 2,350 MHz to about 2,360 MHz), and Band 40 in the LTE. In this case, it is possible to improve the isolation between the signals in the configuration in which the middle bands and the high bands in the LTE are subjected to CA and non-CA to reduce the signal propagation loss.

In the combinations from (1) to (4) described above, each of the RF module 1 according to the first embodiment and the RF module 1A according to the second embodiment is also applied to, for example, an RF module supporting four bands of Band 1, Band 3, Band 7, and Band 40. In this case, Band 1 may be applied as the first frequency band (the band A) and Band 3 may be applied as the second frequency band (the band B). Alternatively, Band 7 may be applied as the first frequency band (the band A) and Band 40 may be applied as the second frequency band (the band B).

In addition, each of the RF module 1 according to the first embodiment and the RF module 1A according to the second embodiment is also applied to, for example, an RF module supporting four bands of Band 25, Band 66, Band 7, and Band 30. In this case, Band 66 may be applied as the first frequency band (the band A) and Band 25 may be applied as the second frequency band (the band B).

The present disclosure is widely usable for a communication device, such as a mobile phone, as a radio-frequency module arranged in a multiband front end unit.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio-frequency module comprising:
   a switch integrated circuit comprising a first main face and an opposing second main face, a first connection electrode arranged on the first main face, and a second connection electrode arranged on the second main face;
   at least one mounting substrate in or on which the switch integrated circuit is mounted, and that comprises a first mounting face at the first main face side, and a second mounting face at the second main face side;
   a first signal line at the first mounting face side of the at least one mounting substrate, the first signal line being connected to the first connection electrode and configured to transmit a radio-frequency signal in a first frequency band;
   a second signal line at the second mounting face side of the at least one mounting substrate, the second signal line being connected to the second connection electrode and configured to transmit a radio-frequency signal in a second frequency band, the second frequency band being different than the first frequency band;
   a first electronic component connected to the first signal line; and
   a second electronic component connected to the second signal line,
   wherein the first electronic component, but not the second electronic component, is mounted on the first mounting face, and
   wherein the second electronic component, but not the first electronic component, is mounted on the second mounting face.

2. The radio-frequency module according to claim 1, wherein the switch integrated circuit comprises:
   a switch configured to selectively transmit the radio-frequency signal in the first frequency band on the first signal line, and to selectively transmit the radio-frequency signal in the second frequency band on the second signal line, based on a control signal, and
   a control circuit configured to selectively supply the control signal to the switch.

3. The radio-frequency module according to claim 2, wherein the transmission of the radio-frequency signal in the first frequency band on the first signal line and the transmission of the radio-frequency signal in the second frequency band on the second signal line are concurrently performed through the selective control of the switch.

4. The radio-frequency module according to claim 1, wherein the at least one mounting substrate is one mounting substrate having the first mounting face and the second mounting face, and
   wherein the switch integrated circuit is mounted in the mounting substrate.

5. The radio-frequency module according to claim 4, wherein the first mounting face and the first electronic component are covered with first resin, and
   wherein the second mounting face and the second electronic component are covered with second resin.

6. The radio-frequency module according to claim 1, wherein the at least one mounting substrate comprises a first mounting substrate having the first mounting face and a second mounting substrate having the second mounting face, and
   wherein the switch integrated circuit is arranged between the first mounting substrate and the second mounting substrate, the first connection electrode being joined to the first mounting substrate, and the second connection electrode being joined to the second mounting substrate.

7. The radio-frequency module according to claim 6, wherein the first mounting face and the first electronic component are covered with first resin,
   wherein the second mounting face and the second electronic component are covered with second resin, and
   wherein the switch integrated circuit is covered with third resin.

8. The radio-frequency module according to claim 1, wherein the first electronic component comprises a filter having the first frequency band as a pass band, and
   wherein the second electronic component comprises a filter having the second frequency band as a pass band.

9. The radio-frequency module according to claim 1, wherein the first electronic component comprises a first amplifier configured to amplify the radio-frequency signal in the first frequency band, and
   wherein the second electronic component comprises a second amplifier configured to amplify the radio-frequency signal in the second frequency band.

10. The radio-frequency module according to claim 1, wherein the at least one mounting substrate is a multilayer substrate, and wherein each of the first signal line and the second signal line are intralayer lines in the at least one mounting substrate.

11. The radio-frequency module according to claim 1, wherein the first frequency band is Band 1, Band 66, or Band 34 of Long Term Evolution, and
wherein the second frequency band is Band 3, Band 25, or Band 39 of Long Term Evolution.

12. The radio-frequency module according to claim 1, wherein the first frequency band is Band 7 of Long Term Evolution, and
wherein the second frequency band is Band 40 of Long Term Evolution.

13. The radio-frequency module according to claim 1, wherein the first frequency band is Band 8 or Band 26 of Long Term Evolution, and
wherein the second frequency band is Band 20, Band 28, Band 12, Band 13, or Band 29 of Long Term Evolution.

14. The radio-frequency module according to claim 1, wherein the first frequency band is Band 1, Band 66, Band 34, Band 3, Band 25, or Band 39 of Long Term Evolution, and
wherein the second frequency band is Band 7, Band 41, Band 30, or Band 40 of Long Term Evolution.

15. A communication apparatus comprising:
a radio-frequency signal processing circuit configured to process a radio-frequency signal transmitted and received through an antenna; and
the radio-frequency module according to claim 1, and configured to transmit the radio-frequency signal between the antenna element and the radio-frequency signal processing circuit.

* * * * *